United States Patent
Zoladz (10) Patent No.: US 10,819,053 B1
(45) Date of Patent: Oct. 27, 2020

(54) STACKED MULTIPORT 10GBASE-T MIDSPAN PSE FOR IEEE STANDARD 802.3BT STANDARD

(71) Applicant: Microsemi P.O.E. Ltd., Hod Hasharon (IL)

(72) Inventor: Diego Zoladz, Modiin (IL)

(73) Assignee: Microsemi P.O.E. Ltd., Hod Hasharon (IL)

( * ) Notice: Subject to any disclaimer, the term of this patent is extended or adjusted under 35 U.S.C. 154(b) by 0 days.

(21) Appl. No.: 16/512,930

(22) Filed: Jul. 16, 2019

Related U.S. Application Data (60) Provisional application No. 62/867,530, filed on Jun. 27, 2019.

(51) Int. Cl.
| | |
|---|---|
| *H01R 12/72* | (2011.01) |
| *H01R 13/514* | (2006.01) |
| *H05K 1/18* | (2006.01) |
| *H01R 24/64* | (2011.01) |
| *H01R 107/00* | (2006.01) |

(52) U.S. Cl.
CPC ......... *H01R 12/722* (2013.01); *H01R 13/514* (2013.01); *H01R 24/64* (2013.01); *H05K 1/181* (2013.01); *H01R 2107/00* (2013.01); *H05K 2201/10189* (2013.01)

(58) Field of Classification Search
CPC .... H01R 12/722; H01R 13/514; H01R 24/64; H01R 2107/00; H05K 1/181
USPC .......................................................... 439/78
See application file for complete search history.

(56) References Cited

U.S. PATENT DOCUMENTS

| | | | | |
|---|---|---|---|---|
| 7,033,210 | B1 * | 4/2006 | Laurer | H01R 13/6658 439/541.5 |
| 7,153,158 | B1 * | 12/2006 | Lee | H01R 13/6658 439/541.5 |
| 7,259,325 | B2 * | 8/2007 | Pincu | H04Q 1/02 174/50 |
| 7,280,032 | B2 * | 10/2007 | Aekins | H04B 3/32 340/12.32 |
| 7,530,854 | B2 * | 5/2009 | Aekins | H01R 13/7195 439/676 |
| 8,062,049 | B2 * | 11/2011 | Tobey | H01R 13/514 439/345 |

(Continued)

FOREIGN PATENT DOCUMENTS

| | | | |
|---|---|---|---|
| CN | 206932325 | * | 12/2018 |
| WO | 2011056968 A2 | | 5/2011 |

OTHER PUBLICATIONS

PCT/IL2019/050934, International Search Report and Written Opinion, dated Feb. 27, 2020.

*Primary Examiner* — Peter G Leigh
(74) *Attorney, Agent, or Firm* — Glass and Associates; Kenneth Glass (57) ABSTRACT

A stacked RJ45 modular jack assembly includes a lower RJ45 jack portion having a bottom surface adapted to be mounted on a printed circuit board, the lower RJ45 jack having a plurality of lower connection fingers 1 through 8, an upper RJ45 jack portion disposed above the lower RJ45 jack portion the upper RJ45 jack having a plurality of upper connection fingers 1 through 8, and a data/RF components block including RF components, the data/RF components block mounted directly behind a rear surface of the stacked RJ45 modular jack assembly.

5 Claims, 4 Drawing Sheets

(56) References Cited

U.S. PATENT DOCUMENTS

| | | | | |
|---|---|---|---|---|
| 9,397,450 B1 * | 7/2016 | Feng | ............... | H01R 13/659 |
| 9,408,335 B2 * | 8/2016 | Edwards | ............ | H01R 13/719 |
| 2003/0194912 A1 * | 10/2003 | Ferentz | ............ | H01R 13/6658 |
| | | | | 439/676 |
| 2008/0305680 A1 * | 12/2008 | Little | ............ | H01R 13/514 |
| | | | | 439/541.5 |
| 2008/0305692 A1 * | 12/2008 | Little | ............ | H01R 13/6658 |
| | | | | 439/676 |
| 2011/0053418 A1 * | 3/2011 | Margulis | ............ | H01R 13/719 |
| | | | | 439/620.07 |
| 2012/0176756 A1 * | 7/2012 | Gailus | ............ | H01R 13/6633 |
| | | | | 361/752 |
| 2015/0056825 A1 * | 2/2015 | Hsu | ............ | H01R 13/6587 |
| | | | | 439/78 |

* cited by examiner

STACKED MULTIPORT 10GBASE-T MIDSPAN PSE FOR IEEE STANDARD 802.3BT STANDARD

The present invention relates to Ethernet appliances. More particularly, the present invention relates to stacked multiport 10GBase-T Midspan power sourcing equipment (PSE) appliances and to connector assemblies for such appliances.

BACKGROUND

10Base-T Ethernet appliances usually include one or more RJ45 jacks for accepting Ethernet cables. Some Ethernet appliances include numerous RJ45 jacks, and modular stacked RJ45 jacks 10 such as that shown in FIG. 1 have been provided to allow efficient and space-saving assembly of the Ethernet appliances. Connections are made to a printed circuit board on which the modular stacked RJ45 jack 10 is mounted using pins (some of which are identified at reference numeral 12).

Figure 1:
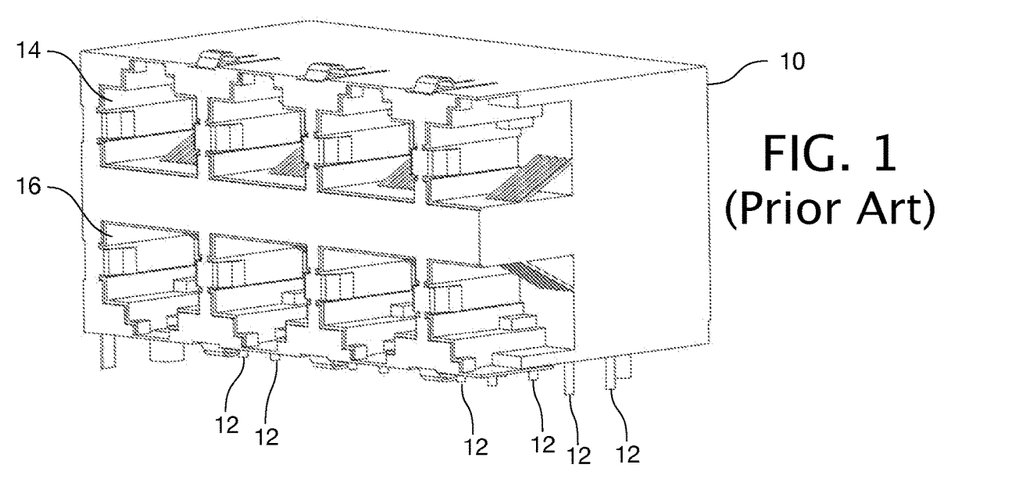
FIG. 1 is an isometric drawing of a prior-art modular RJ45 jack assembly.

Some Ethernet appliances are PSE appliances and provide power over Ethernet (PoE) to supply DC power required by connected devices such as cameras. The modular stacked RJ45 jacks such as that shown in FIG. 1 are often used for this purpose with one top and one bottom jack, of each of a plurality of pairs of the jacks identified at reference numerals 14 and 16, respectively, serving as the data input connection and data output+PoE power connection.

The new IEEE Standard 802.3bt standard defines a Midspan PSE that results in a link that can support 10GBase-T operation. Because of technological and mechanical issues, there are no commercially available solutions in the market that support multiport Midspan PSE operation at this data rate. As a fundamental building block, there are no commercially available stacked modular RJ45 jacks which are compatible with category 6A (CAT 6A) as defined by defined by TIA/EIA-568. A solution for a multiport Midspan PSE supporting 10GBase-T operation thus is challenged by the lack of basic building blocks needed for multiport Midspan PSE design.

One of the difficulties encountered in providing a stacked modular CAT6A compatible RJ45 jack is that it requires providing signal traces inside the passive integrated connector magnetics (ICM) having lengths that are too long to meet transmission requirements for CAT6A. These relatively long internal signal traces cannot be impedance matched at 100 ohms to meet specification requirements. This considerably affects the return loss, insertion loss and near-end crosstalk (NEXT) to the point where the present mechanical configuration of commercially available modular RJ45 jacks does not allow for construction of a multiport Midspan PSE which meets the IEEE Standard 802.3bt standard requirements for a Midspan PSE. The standard for the device transmission requirements defines, inter-alia, "The Midspan PSE equipment to be inserted as "connector" or "telecom outlet" shall meet the following transmission parameters. These parameters should be measured using the test procedures of ISO 11801:2002 or ANSI/TIA-568-C.2 for connecting hardware. Replacing the work area or equipment cable with a cable that includes a Midspan PSE should not alter the requirements of the cable. For Highest PHY rate which support up 10GBASE-T (Frequency up to 500 Mhz) the cord specification is: Category 6A cord in ISO/IEC 11801-1 or ANSI/TIA-568-C.2."

Figure 2A:
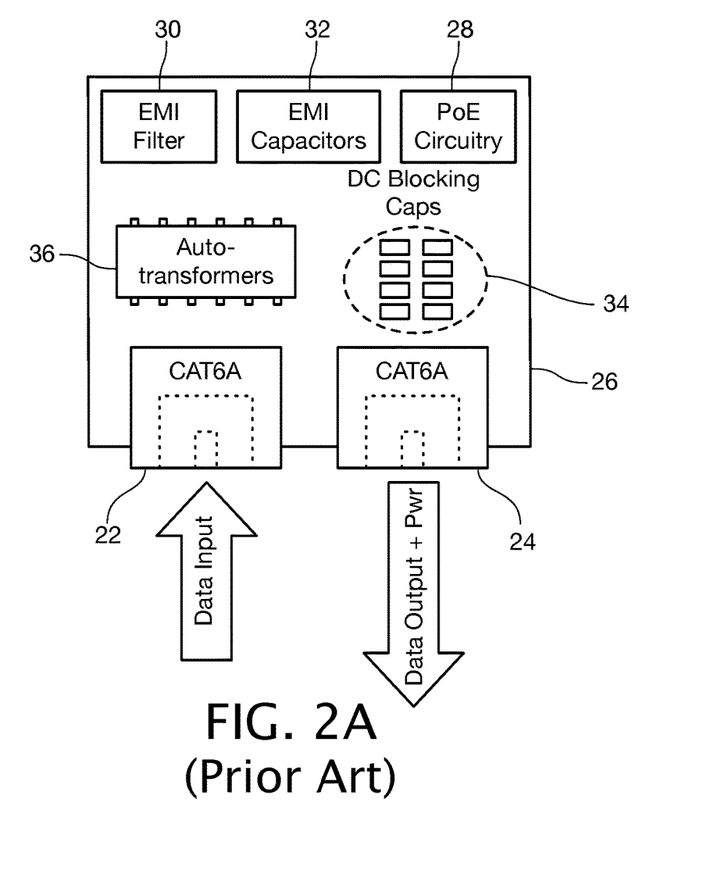
FIG. 2A is an isometric drawing showing a pair of single RJ45 jacks that can be employed to provide PoE in a prior-art Midspan ethernet appliance.

It is possible to meet the standard by using a single port CAT6A (1 floor RJ45) connectors. If two of these connectors (one for input data and the other for output data and PoE power) are mounted close to one other, and the PCB layout with the required magnetics and data capacitors is designed according to controlled impedance rules to match 100 ohms, then it is possible to obtain a solution for a 1 port Midspan. Such an arrangement is shown in FIG. 2A in which a pair of single port CAT6A compatible (1 floor RJ45) connectors 22 and 24 are mounted on a PCB 26 (usually in the form of a microstrip). Connector 22 is arranged to receive data input, and connector 24 is arranged to provide data output+power, it being understood that all data communication in this environment is bidirectional. The PoE circuitry 28, i.e. circuitry which supplies the power to be added onto the data lines, EMI filter 30 and EMI capacitors 32 for the PoE power being supplied by PoE circuitry 28, DC blocking capacitors (indicated collectively within dashed lines 34) in the data path and a packaged set of autotransformers 36 are mounted on a PCB immediately adjacent to the RJ45 blocks 22 and 24. It is possible to multiply this option in order to obtain additional ports, but this is an expensive and impractical solution because it requires twice as much PCB area for each port than a stacked RJ45 connector.

Figure 2B:
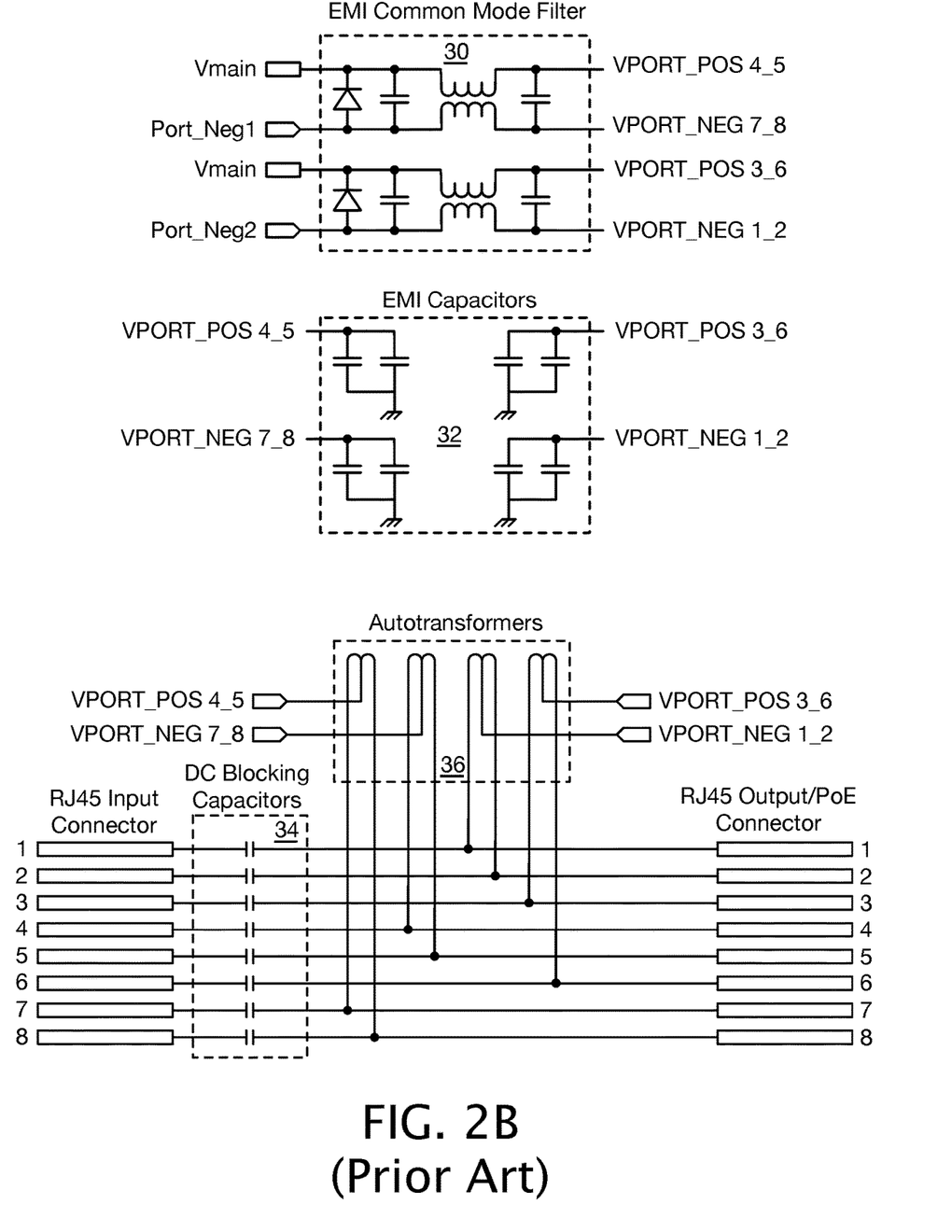
FIG. 2B is a schematic diagram illustrating the EMI components and the data components typically employed in a Multiport Midspan PSE.

Referring now to FIG. 2B, a schematic diagram shows a typical configuration of the EMI filter 30, shown as a common mode filter, and EMI capacitors 32, both for the power lines coming from PoE circuitry 28 (PoE circuitry 28 not shown), which EMI filter 30 and EMI capacitors 32 are provided per port, as well as the DC blocking capacitors 34 and the packaged set of autotransformers 36 which are in the data path. All of these components are mounted together on a PCB, with the appropriate connections to the PoE circuitry 28, which is similarly mounted on the PCB. The combination of DC blocking capacitors 34 and autotransformers 36 in the data path, allow for data passage without unacceptable degradation, while allowing for the addition of power, as described in U.S. Pat. No. 8,195,965 to Darshan, whose entire contents are incorporated herein by reference. The path from fingers 1 through 8 from the RJ45 input connector to fingers 1 through 8 of the RJ45 output connector are illustrated, with DC blocking capacitors 34 connected in line for each connection, further showing the connections from a first power port (denoted VPORT_POS 4_5 to VPORT_NEG 7_8) and second power port (denoted VPORT_POS 3_6 to VPORT_NEG 1_2) as known to those skilled in the art.

Figure 3:
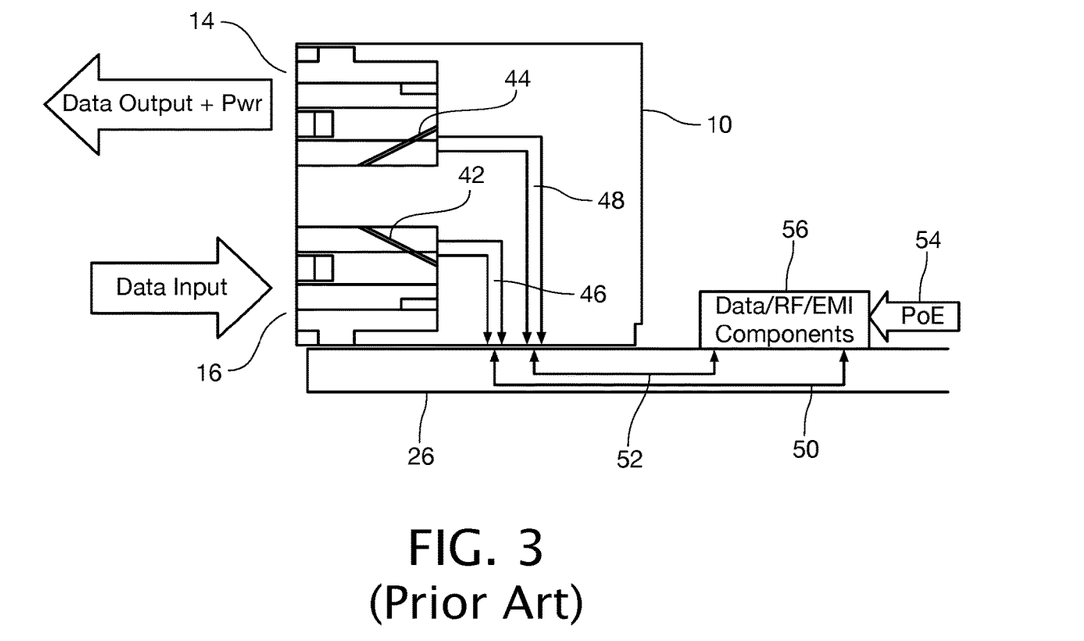
FIG. 3 is a cross-sectional view of a prior-art modular RJ45 jack assembly mounted on a PCB showing the internal signal traces that are used to connect the jack fingers to the PCB.

FIG. 3 is a side view of prior-art modular stacked RJ45 jacks 10 mounted on a PCB 26 that illustrates the problem. The top and bottom pair of the jacks 14 and 16 include conductors 46 and 48 that are needed to make electrical connections from the connecting fingers 42 of the bottom jack and 44 of the top jack to conductive traces 50 and 52, respectively for carrying the data signals and PoE DC power from PoE 54 through the data/RF/EMI circuitry 56 mounted on the PCB, where data/RF/EMI circuitry 56 represents a combination of the EMI filter 30, EMI capacitors 32, as well as the DC blocking capacitors 34 and autotransformers 36. As shown in FIG. 3, the relatively long signal traces 48 that are used to connect the jack connecting fingers 44 of the top connector 14 in the stack to the traces 52 on the PCB cannot be impedance matched to the signal path sourcing the input jack 16 and driving the output jack 14 of the multiport Midspan PSE. The lack of impedance matching severely degrades the return loss, insertion loss and NEXT of the connection, making the multiport Midspan PSE unable to meet the requirements of IEEE 802.3bt.

BRIEF DESCRIPTION

According to an aspect of the invention, a stacked RJ45 modular jack assembly includes a lower RJ45 jack portion having a bottom surface adapted to be mounted on a printed circuit board, the lower RJ45 jack having a plurality of lower connection fingers 1 through 8, an upper RJ45 jack portion disposed above the lower RJ45 jack portion the upper RJ45 jack having a plurality of upper connection fingers 1 through 8, and a data/RF components block including RF components, the data/RF components block mounted directly behind a rear surface of the stacked RJ45 modular jack assembly.

According to an aspect of the invention, the data/RF components block includes capacitors and inductors connected to the upper connection fingers and the lower connection fingers.

According to an aspect of the invention, the capacitors comprise a plurality of DC blocking capacitors mounted directly behind a rear surface of the stacked RJ45 modular jack assembly, each DC blocking capacitor connected between corresponding ones of the upper connection fingers and the lower connection fingers, and the inductors comprise a plurality of autotransformer coils mounted directly behind the rear surface of the paired port stacked RJ45 modular jack assembly, a first autotransformer coil connected directly between upper connection fingers 1 and 2, a second autotransformer coil connected directly between upper connection fingers 3 and 6, a third autotransformer coil connected directly between upper connection fingers 4 and 5, a fourth autotransformer coil connected directly between upper connection fingers 7 and 8.

According to an aspect of the invention, a circuit assembly includes a printed circuit board, a stacked RJ45 modular jack assembly mounted on the printed circuit board and including, a lower RJ45 jack portion having a bottom surface adapted to be mounted on a printed circuit board, the lower RJ45 jack having a plurality of lower connection fingers 1 through 8, an upper RJ45 jack portion disposed above the lower RJ45 jack portion the upper RJ45 jack having a plurality of upper connection fingers 1 through 8, a data/RF components block including RF components mounted directly behind a rear surface of the stacked RJ45 modular jack assembly, and EMI component circuitry mounted on the PCB and connected through conductive traces to printed circuit board connection pins for one of the upper and lower plurality of connection fingers on the RJ45 jack portions, the EMI component circuitry having connections for a source of PoE power.

According to an aspect of the invention, the data/RF components block in the circuit assembly includes a plurality of capacitors mounted directly behind a rear surface of the paired port stacked RJ45 modular jack assembly, each data capacitor connected between corresponding ones of the upper connection fingers and the lower connection fingers, and a plurality of autotransformer coils mounted directly behind the rear surface of the paired port stacked RJ45 modular jack assembly, a first autotransformer coil connected directly between upper connection fingers 1 and 2, a second autotransformer coil connected directly between upper connection fingers 3 and 6, a third autotransformer coil connected directly between upper connection fingers 4 and 5, a fourth autotransformer coil connected directly between upper connection fingers 7 and 8, a center tap of each of the first through fourth autotransformer coils connected to a conductor terminating in one of the printed circuit board connection pins.

According to an aspect of the invention, a method of providing a stacked RJ45 modular jack for providing multiport 10GBase-T Midspan power over Ethernet, the method includes providing a stacked RJ45 modular jack, the stacked RJ45 modular jack having an upper RJ45 jack portion and a lower RJ45 jack portion each of the upper and lower portions having connecting fingers, and disposing a data/RF components block directly behind the connecting fingers of the upper and lower portions of the stacked RJ45 modular jack, the RF components block including RF components connected to ones of the connecting fingers of the upper and lower portions of the stacked RJ45 modular jack.

According to an aspect of the invention, disposing an RF components block directly behind the connecting fingers of the upper and lower portions of the stacked RJ45 modular jack comprises connecting DC blocking capacitors between corresponding ones of the connecting fingers of the upper and lower portions of the stacked RJ45 modular jack.

According to an aspect of the invention, the method further includes connecting autotransformers between adjacent pairs of the connecting fingers of one of the upper and lower portions of the stacked RJ45 modular jack.

According to an aspect of the invention, a method for providing stacked multiport 10GBase-T Midspan power over Ethernet includes providing a printed circuit board, providing a DC power connection through an electromagnetic interference filter on the printed circuit board, providing a stacked RJ45 modular jack on the printed circuit board, the stacked RJ45 modular jack having an upper RJ45 jack portion and a lower RJ45 jack portion and having connections to the provided DC power connection, and connecting an RF components block on the stacked RJ45 modular jack between connection fingers on the upper RJ45 jack portion and the lower RJ45 jack portion.

According to an aspect of the invention, connecting the RF components block on the stacked RJ45 modular jack between connection fingers on the upper RJ45 jack portion and the lower RJ45 jack portion comprises providing an RF circuit block having a circuit path matching a 100-ohm characteristic impedance.

According to an aspect of the invention, providing the stacked RJ45 modular jack on the printed circuit board having connections to the DC power connection comprises providing pins on a bottom surface of the stacked RJ45 modular jack that mate with holes on the printed circuit board providing the DC connection.

According to an aspect of the invention, connecting the RF circuit block on the stacked RJ45 modular jack between connection fingers on the upper RJ45 jack portion and the lower RJ45 jack portion comprises mounting the RF circuit block on a rear surface of the stacked RJ45 modular jack and making electrical connections between the RF circuit block and connection fingers on the upper RJ45 jack portion and the lower RJ45 jack portion of the stacked RJ45 modular jack.

According to an aspect of the invention, a multiport Midspan power sourcing equipment appliance includes a printed circuit board, at least one stacked RJ45 modular jack assembly mounted on the printed circuit board and including at least one set of RJ45 jacks, each of the at least one set of RJ45 jacks and including, a lower RJ45 jack portion having a bottom surface adapted to be mounted on a printed circuit board, the lower RJ45 jack having a plurality of lower connection fingers 1 through 8, an upper RJ45 jack portion disposed above the lower RJ45 jack portion the upper RJ45 jack having a plurality of upper connection fingers 1 through 8, a data/RF components block including RF components, the data/RF components block mounted directly behind a rear surface of the stacked RJ45 modular jack assembly, and EMI component circuitry mounted on the PCB connected to each at least one paired port set of RJ45 jacks, the EMI component circuitry having connections for a source of PoE power.

According to an aspect of the invention, the at least one stacked RJ45 modular jack assembly mounted on the printed circuit board comprises a plurality of stacked RJ45 modular jack assemblies.

According to an aspect of the invention, the PCB is mounted in 1U rack enclosure.

According to an aspect of the invention, the at least one stacked RJ45 modular jack assembly includes at least four sets of RJ45 jacks.

BRIEF DESCRIPTION OF THE DRAWING FIGURES

The invention will be explained in more detail in the following with reference to embodiments and to the drawing in which are shown.

DETAILED DESCRIPTION

Persons of ordinary skill in the art will realize that the following description is illustrative only and not in any way limiting. Other embodiments will readily suggest themselves to such skilled persons.

In order for Midspan power sourcing equipment (PSE) connected to the physical interface circuitry (MDI) to meet the requirements of Conducted Emissions From Analog/Digital Data ports (EN 55032:2012+AC:2013, Class B), electro-magnetic interference (EMI) filtering for the PoE DC power is required. EMI filters for this purpose typically include a common mode choke and capacitors. In addition to this requirement, due to the fact the Midspan PSE equipment is inserted as "connector" or "telecom outlet" and for 10GBase-T must meet the transmission parameters according to CAT6A requirements, special dedicated magnetics (auto-transformer), DC blocking capacitors and impedance matching for these components in the signal path are required.

In order to meet these requirements, in accordance with the present invention the signal conditioning components including the magnetics (i.e. auto-transformer) and the DC blocking capacitors are separated from the EMI filter components (common mode choke and capacitors for the PoE EMI filter), and the signal conditioning components are integrated inside the stacked RJ-45 module adjacent the RJ45 legs. This reduces the lengths of the data signal-carrying traces and allows for a controlled-impedance circuit layout design to provide an impedance of the required 100 ohms. Only the DC power lines descend to the printed circuit board and connect to the EMI filter and the PoE circuitry remaining on the PCB. Because the EMI filter and PoE circuitry are no longer in the path of the high frequency signals, no controlled-impedance circuit layout design is required for this group of components. The component layout of the present invention significantly improves the transmission performance and makes possible the development of multiport Midspan PSE for 10GBase-T. In addition, the present invention considerably simplifies the integrated solution and reduces the cost for PCB layout for such a multiport Midspan.

Figure 4:
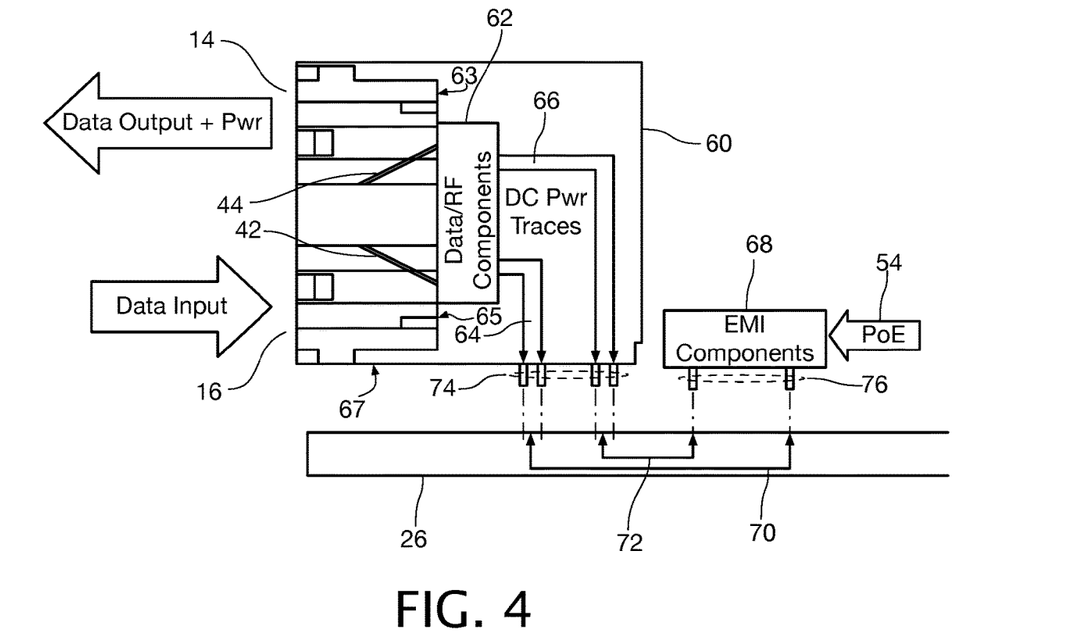
FIG. 4 is a cross-sectional view of a modular RJ45 jack assembly in accordance with an aspect of the present invention mounted on a PCB showing the internal signal traces connecting the jack fingers to the data RF components and the power traces for the PoE descending to the PCB.

Referring now to FIG. 4, a cross-sectional view shows a modular RJ45 jack assembly 60 in accordance with an aspect of the present invention that mounts on PCB 26 showing a data/RF components block 62 that mounts directly behind and electrically connected to the connection fingers 42 and 44, respectively, of the bottom jack 16 and the top jack 14. Data/RF components block 62 includes the RF components DC blocking capacitors 34 and autotransformers 36 and implements the signal conditioner of the above referenced U.S. Pat. No. 8,195,965. From a circuit diagram point of view, the data signal path in the modular RJ45 jack assembly 60 of the present invention includes the same arrangement of circuit elements as the data signal path between the respective lower connection fingers 1 through 8 of the bottom RJ45 jack 16 and upper connection finger 1 through 8 of the top RJ45 jack 14 that is depicted in FIG. 2B that were mounted on the PCB, but by organizing and arranging these components in accordance with the concepts of the present invention, the length of the data signal path is significantly reduced as compared to the prior art. In the embodiment shown in FIG. 4, top RJ45 jack 14 is disposed in a housing having a rear surface 63 and bottom RJ45 jack 16 is disposed in a housing having a rear surface 65. Data/RF components block 62 is mounted directly behind rear surface 63 and rear surface 65. Modular RJ45 jack assembly 60 has a bottom surface 67 adapted to be mounted on printed circuit board 26.

The conductive traces 64 and 66, respectively carry only the PoE DC power from PoE 54 delivered through the EMI component circuitry 68 that mounts on the PCB 26. Connections are made between the conductive traces 64 and 66 in modular RJ45 jack assembly 60 and the EMI component circuitry 68 through PCB traces 70 and 72 and by respective printed circuit board connection pins 74 and 76. As shown in FIG. 4, by placing the DC blocking capacitors 34 and autotransformers 36 in the data/RF components block 62 mounted close to the jack fingers 42 and 44 of the RJ45 connectors 14 and 16, the only traces that need to descend to the PCB are the PoE power traces 64 and 66 carrying DC power. This eliminates the relatively long signal traces 46 and 48 that are used to connect the jack fingers 42 and 44 to the data/RF/EMI component block 56 in the prior-art arrangement shown in FIG. 3. The high-frequency performance of the data signal path through the modular RJ45 jack assembly 60 of the present invention is significantly improved because it is possible to design the physical component layout of data/RF components block 62 to provide the needed 100-ohm impedance along the signal path from the input data RJ45 jack to the output data and PoE RJ45 jack.

The present invention is a stacked 10GBase-T RJ 45 connector with integrated connector magnetics (ICM) which enables PoE for a Midspan PSE that meets the IEEE802.3bt standard. The stacked 10GBase-T RJ 45 connector is mechanically substantially similar to existing regular stacked RJ45 connectors. Also, preferably the connector leg disposition and module size is the same as prior-art modules.

Unlike other RJ45 connectors with ICM commonly used for switches, where magnetics, common mode and terminations have external pins to the printed circuit board, which are connected to a PHY, the present invention eliminates high speed 10GBase-T signal trace connections between the RJ45 connector with ICM module and the printed circuit board. The entire transmission segment-path is enclosed completely inside the module, providing improved performance to the Midspan PSE. The only external pins connected to the printed circuit board are the DC power lines to which the PoE circuitry and EMI filter are connected.

Figure 5:
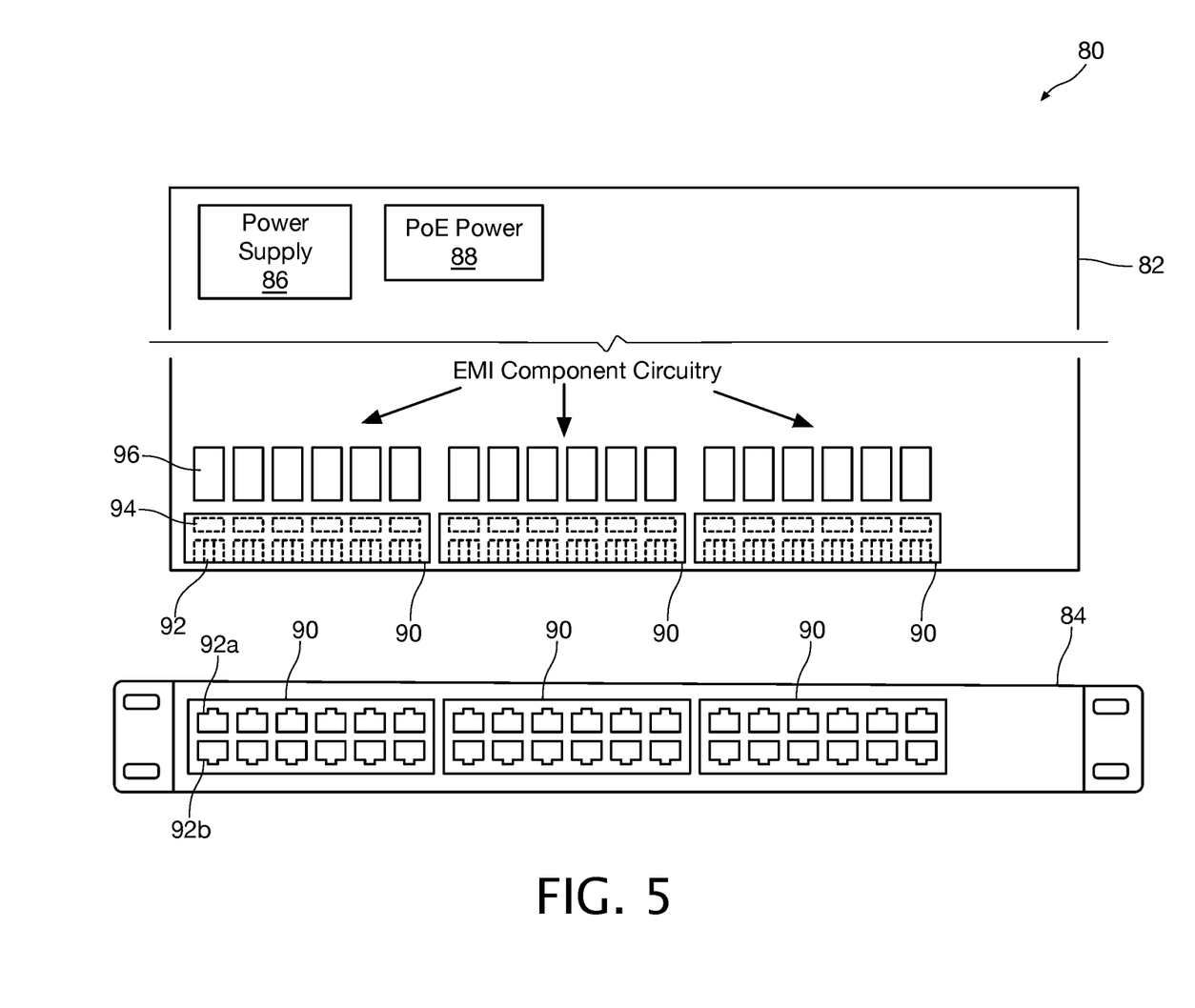
FIG. 5 is a diagram showing top and front views of an illustrative multiport midspan power sourcing equipment appliance in accordance with an aspect of the present invention.

Referring now to FIG. 5, a diagram shows top and front views of an illustrative multiport Midspan power sourcing equipment appliance 80 in accordance with an aspect of the present invention. Persons of ordinary skill in the art will observe that the depiction of the multiport Midspan power sourcing equipment appliance 80 in FIG. 5 does not show features of such an appliance that are not related to the present invention and such skilled persons will nonetheless realize that the features not shown in FIG. 5 will be provided in any actual multiport midspan power sourcing equipment appliance product configured in accordance with the present invention.

The multiport midspan power sourcing equipment appliance 80 includes a PCB 82 mounted in an enclosure having a front panel 84. The front panel 84 is shown as a familiar 1U rack mount unit as is known in the art. A power supply 86 and PoE circuitry 88 are provided on the PCB 82.

A plurality of stacked RJ45 modular jack assemblies 90 configured in accordance with the present invention are mounted on the PCB 82. The plurality of stacked RJ45 modular jack assemblies 90 configured in accordance with the present invention may typically include between four and six pairs of paired port RJ45 jacks. In the particular embodiment shown in FIG. 5 each of the stacked RJ45 modular jack assemblies 90 is shown including six pairs of paired port RJ45 jacks (only one of which is identified with reference numeral 92 in the top view portion of FIG. 5 in order to avoid unnecessarily overcomplicating the drawing figure) that are each configured in accordance with the present invention. Persons of ordinary skill in the art will appreciate that the particular stacked RJ45 modular jack assemblies 90 depicted in FIG. 5 are illustrative only and non-limiting in that stacked RJ45 modular jack assemblies having numbers of pairs of RJ45 jacks 92 other than six are contemplated as being within the scope of the preset invention.

Each set of RJ45 jacks includes an upper RJ45 jack and a lower RJ45 jack (only one pair of which are designated using reference numerals 92a and 92b in the front view portion of FIG. 5 in order to avoid unnecessarily overcomplicating the drawing figure). Each pair of RJ45 jacks 92a and 92b in the stacked RJ45 modular jack assemblies 90 is connected to a respective Data/RF components block 94 that includes the DC blocking capacitors 34 and autotransformers 36 shown in FIG. 2B. Only one Data/RF components block is identified with reference numeral 94 in the top view portion of FIG. 5 in order to avoid unnecessarily overcomplicating the drawing figure). The EMI component circuitry that is associated with each pair of RJ45 jacks and that is described with reference to FIGS. 2B and 4 (only one of which is identified with reference numeral 96 in the top view portion of FIG. 5 in order to avoid unnecessarily overcomplicating the drawing figure) is mounted on the PCB 82.

The present invention makes it possible for a multiport Midspan PSE to meet the IEEE802.3bt standard requirements and allows provision of a full 24-port solution in a 1U stackable Midspan PSE. The present invention avoids the drawbacks of employing one-port RJ45 CAT6A connectors.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A stacked RJ45 modular jack assembly comprising:
a bottom RJ45 jack having a plurality of lower connection fingers 1 through 8, the stacked RJ45 modular jack assembly having a bottom surface adapted to be mounted on a printed circuit board;
a top RJ45 jack disposed above the bottom RJ45 jack, the top RJ45 jack having a plurality of upper connection fingers 1 through 8; and
a data/RF components block including RF components, the data/RF components block mounted directly behind a rear surface of the top RJ45 jack and a rear surface of the bottom RJ45 jack, the data/RF components block including DC blocking capacitors connected between corresponding ones of the upper connection fingers and the lower connection fingers and a plurality of autotransformers, the plurality of autotransformers including a first autotransformer connected directly between upper connection fingers 1 and 2, a second autotransformer connected directly between upper connection fingers 3 and 6, a third autotransformer connected directly between upper connection fingers 4 and 5 and a fourth autotransformer connected directly between upper connection fingers 7 and 8.

2. A circuit assembly comprising:
a printed circuit board;
a stacked RJ45 modular jack assembly mounted on the printed circuit board, the stacked RJ45 modular jack assembly having a bottom surface adapted to be mounted on the printed circuit board, the stacked RJ45 modular jack assembly including:
a bottom RJ45 jack having a plurality of lower connection fingers 1 through 8;
a top RJ45 jack disposed above the bottom RJ45 jack, the top RJ45 jack having a plurality of upper connection fingers 1 through 8;
a data/RF components block including RF components mounted directly behind a rear surface of the top RJ45 jack and behind a rear surface of the bottom RJ45 jack, the data/RF components block including DC blocking capacitors connected between corresponding ones of the upper connection fingers 1 through 8 and the lower connection fingers 1 through 8, and a plurality of autotransformers, including a first autotransformer connected directly between upper connection fingers 1 and 2, a second autotransformer connected directly between upper connection fingers 3 and 6, a third autotransformer connected directly between upper connection fingers 4 and 5 and a fourth autotransformer connected directly between upper connection fingers 7 and 8; and EMI component circuitry mounted on the printed circuit board and connected through conductive traces to printed circuit board connection pins connected to one of the upper connection fingers and the lower connection fingers, the EMI component circuitry having connections for a source of PoE power.

3. A method of providing a stacked RJ45 modular jack for providing multiport 10GBase-T Midspan power over Ethernet, the method comprising:

providing a top RJ45 jack having a plurality of upper connection fingers;

providing a bottom RJ45 jack having a plurality of lower connection fingers; and disposing a data/RF components block directly behind the upper connection fingers and the lower connection fingers, the data/RF components block including DC blocking capacitors connected between corresponding ones of the upper connection fingers and the lower connection fingers and autotransformers connected between adjacent pairs of the connection fingers of one of the upper connection fingers and the lower connection fingers.

4. A method for providing stacked multiport 10GBase-T Midspan power over Ethernet comprising:

providing a printed circuit board;

providing a DC power connection through an electromagnetic interference filter on the printed circuit board;

providing a top RJ45 jack and a bottom RJ45 jack; and connecting an RF components block between upper connection fingers on the top RJ45 jack and lower connection fingers on the bottom RJ45 jack, the RF components block including DC blocking capacitors connected between corresponding ones of the upper connection fingers and the lower connection fingers and autotransformers connected between adjacent pairs of the connection fingers of one of the upper connection fingers and the lower connection fingers.

5. The method of claim 4 wherein connecting the RF components block comprises providing an RF circuit block having a circuit path matching a 100-ohm characteristic impedance.

* * * * *